United States Patent [19]

Noto et al.

[11] Patent Number: 4,686,629
[45] Date of Patent: Aug. 11, 1987

[54] LOGIC CELL PLACEMENT METHOD IN COMPUTER-AIDED-CUSTOMIZATION OF UNIVERSAL ARRAYS AND RESULTING INTEGRATED CIRCUIT

[75] Inventors: Richard Noto, Maple Shade; David C. Smith, Williamstown, both of N.J.

[73] Assignee: RCA Corporation, Princeton, N.J.

[21] Appl. No.: 886,936

[22] Filed: Jul. 21, 1986

Related U.S. Application Data

[63] Continuation of Ser. No. 608,788, May 10, 1984, abandoned.

[51] Int. Cl.$^4$ ............................................. G06F 15/20
[52] U.S. Cl. .................................. 364/491; 364/488; 357/45
[58] Field of Search ............... 364/488, 489, 491, 300; 357/45; 29/846–848; 174/68.5

[56] References Cited

U.S. PATENT DOCUMENTS

| | | | |
|---|---|---|---|
| 3,603,771 | 9/1971 | Iseff et al. | 364/491 |
| 3,653,071 | 3/1972 | Hill et al. | 364/491 |
| 4,218,693 | 8/1980 | Gee et al. | 357/45 |
| 4,234,888 | 11/1980 | Calhoun et al. | 357/45 |
| 4,412,240 | 10/1983 | Kikuchi et al. | 357/45 |
| 4,500,963 | 2/1985 | Smith et al. | 364/488 |
| 4,577,276 | 3/1986 | Dunlop et al. | 364/488 |
| 4,593,363 | 6/1986 | Burnstein | 364/491 |
| 4,612,618 | 9/1986 | Pryor et al. | 364/488 |
| 4,621,339 | 11/1986 | Wagner | 364/489 |

OTHER PUBLICATIONS

"Automating Chip Layout" by S. Trimberger, CIT, Spectrum, Jun. 1982.
"Bipolar Circuit Design for a 5000-Circuit VLSI Gate Array" by A. H. Dansky, IBM J. Res. Develop., vol. 25, No. 3, May 1981.

Primary Examiner—Parshotam S. Lall
Attorney, Agent, or Firm—Clement A. Barard, Jr.; Raymond E. Smiley; Robert Ochis

[57] ABSTRACT

An improved automatic placement process for placing logic cells in a universal array. Unused basic units are assigned to rows to reduce the congestion of the wiring in high congestion regions of a universal array. These assigned unused basic units are allocated among rows in a pyramidal manner. Those unused basic units allocated to a given row are distributed along that row in a manner to reduce wiring congestion. During a pair exchange portion of the placement process, quality criteria used for deciding whether to exchange two logic cells on different rows include skipped rows in a node, y-span of a node, minimizing the number of logic cells in excess of two in a node on a row, making a longest row shorter and making longer a shortest row or one which is within a tolerance of being a shortest row.

16 Claims, 15 Drawing Figures

PROCESS 400 FOR ESTABLISHING THE TIE POINTS FOR UNUSED BASIC UNITS

LOGIC CELL PLACEMENT METHOD IN COMPUTER-AIDED-CUSTOMIZATION OF UNIVERSAL ARRAYS AND RESULTING INTEGRATED CIRCUIT

STATEMENT OF GOVERNMENT RIGHTS

The Government has rights in this invention pursuant to Contract No. DAAK20-82-C-0397 awarded by the Department of the Army.

RELATED APPLICATIONS

This is a continuation of application Ser. No. 608,788 filed May 10, 1984, now abandoned.

This Patent is related to a patent application entitled, "Routing Method in Computer-Aided Customization of Universal Arrays and Resulting Integrated Circuit" by David C. Smith and Richard Noto, Ser. No. 608,772 co-filed herewith on May 10, 1984, assigned to the present assignee, now U.S. Pat. No. 4,636,965, and incorporated herein by reference.

BACKGROUND OF THE INVENTION

This invention relates to the field of computer aided design of very large scale integration (VLSI) semiconductor circuits and more particularly to the design and production of customizing masks for universal arrays.

Universal array integrated circuits (ICs) are used to test IC designs and for production of ICs. One such universal array is the 800 gate automated universal array or AUA developed by RCA Corporation in cooperation with the Department of the Army under a series of contracts. That AUA is an array of uncommitted devices suitable for conversion into a custom IC by a single patterned customizing conductive layer which can be designed automatically by a computer aided design system from a specification of the IC in terms of logic gates and their interconnections. A plurality of these AUAs are fabricated on a semiconductor wafer. Each AUA comprises an interior row region containing many parallel rows of identical basic units each containing four semiconductor devices. This interior row region is surrounded by a rectangular annular region of peripheral device and contact pads for the connection of external wires to the IC. The rows of basic units are spaced apart by wiring roadbeds. These roadbeds contain wiring channels which run parallel to the length of the rows and wiring lanes which run perpendicular to the length of the rows. Each wiring lane comprises an aligned series of five tunnels which have their adjacent ends spaced apart. All of the tunnels adjacent to one edge of a row comprise a tunnel rank. The next adjacent set of tunnels comprise another tunnel rank and so on. Each tunnel rank has three of the wiring channels disposed thereover.

An electrically insulating layer covers both the semiconductor devices and the tunnels except at predetermined contact points where it is desired to have electrical contact between a semiconductor device or a tunnel and an overlying, conductive, metallic customizing layer. The customizing layer covers an entire major surface of the semiconductor wafer and is initially in electrical contact with the contacts of all the semiconductor devices and tunnels. To customize this universal array semiconductor wafer into a plurality of integrated circuits having a desired set of electrical characteristics, the customizing conductive layer is coated with photoresist and exposed to activating radiation through a custom patterned mask. The custom mask pattern causes the activating radiation to protect those portions of the conductive material which are needed to interconnect the semiconductor devices and tunnels into the desired IC, while leaving unprotected the remaining portions of the customizing conductive layer. The unprotected portions of the customizing layer are removed by etching and the wafer is passivated to prevent environmental damage to the ICs. The completed wafer is tested and diced to provide a plurality of individual ICs all having the desired characteristics.

Where a tunnel in one tunnel rank is to be connected to a tunnel in the next tunnel rank, it can be connected to the aligned tunnel in that next rank or to either of the tunnels adjacent to that aligned tunnel.

The use of a single conductive layer to convert a stock, pre-processed, AUA wafer into a plurality of the desired custom ICs enables rapid completion of the desired ICs once the customizing mask is completed. It is possible to convert a stockpiled wafer into custom ICs in 24 to 48 hours.

Because hand design of a customizing mask for this array is prohibitively time consuming and expensive, an AUA automatic placement and routing system developed by RCA Corporation is used to automatically design the customizing mask. This system, like the array was developed in cooperation with the Department of the Army under a series of contracts. The software for this system is available in source code form from the Army's Electronics Research and Development Command (ERADCOM), Fort Monmouth, N.J. for use on government contracts. That software is known as the AUA or 800 gate AUA program, version 1.5 and is incorporated herein by reference. This computer aided design (CAD) system can produce a customizing mask for this AUA from a specification of the desired IC in terms of logic gates or "logic cells" selected from a set of available "logic cells" and the connections needed between those "logic cells". The term "logic cell" refers to the one or more basic units which when interconnected by customizing conductors form a logic gate such as an AND gate; OR gate, Flip Flop, etc. This CAD system accepts such a specification of the IC and generates a specification of a mask pattern which can be used to pattern the customizing conductive layer to convert a stock 800 gate AUA into the desired custom ICs. This is done through a process involving automatic assignment of logic cells to rows of the universal array, automatic placement of assigned logic cells along the rows and automatic routing of customizing conductors. The resulting mask specification is used to control a mask generating system which converts that specification into the physical pattern of the mask. Thereafter that mask is used in a photoetcher to customize a universal array wafer into a number of the specified ICs.

The computer aided design system must ensure that 100% of the customizing conductors are routed in order for its mask specification to be directly convertible the final mask used to pattern the customizing layer.

Semiconductor area is wasted if a routing system must restrict an IC design to actually using (connecting into its circuit) only a relatively low percentage (such as 60% or 70%) of the universal array's basic units. Some placement and routing systems must impose such restrictions in order to ensure the routing system's ability to complete the routing of 100% of the connecting conductors. It is desirable that the automatic system be able to complete 100% of the routing in circuits which use high percentages (>80%) of the gates which are available in the universal array.

The AUA automatic placement and routing program cited above is capable of routing 100% of the wires in the 800 gate AUA to which it applies, even when as many as 90% or more of the basic units are utiltized in a random logic circuit.

That AUA automatic placement and routing software employs a routing grid in which each point on the grid is defined by a pair of x and y coordinates. The x-axis extends parallel to the length of the rows and the y-axis extends perpendicular to the length of the rows. These routing grid points correspond to physical locations on an actual AUA chip. The grid points are spaced apart in accordance with the design rules of the chip as to conductor width and spacing. Each electrical contact between the customizing layer and a logic cell pin or tunnel contact is located at a grid point. In addition, each location where a conductor may run can be defined in terms of grid points.

The placement part of this AUA software arrives at a final logic cell placement in two phases. In the first phase it tentatively assigns logic cells to individual rows in the row region and then improves that overall assignment through a series of passes through a logic cell exchange routine interleaved with a row length equalization routine.

The cell exchange routine tests whether exchanging a given logic cell on one row with another given logic cell on a different row improves the cell assignment in accordance with its quality criteria. When the logic cells it is proposed to exchange perform different logic functions, they can include significantly different numbers of basic units and therefore can have substantially different lengths. A set of placement quality criteria are evaluated to determine whether a given exchange is an improvement. If the exchange improves the quality of the logic cell placement in accordance with those criteria, then the proposed pair exchange is accepted, otherwise it is rejected. There are several quality criteria. The first is the number of skipped rows for all of the nodes connected to pins of a cell which it is proposed to exchange. A node is a set of pins of active basic units all of which must be connected together by conductors and those connecting conductors. All of the conductors and pins of a node are at the same electrical potential. A skipped row is a row which is crossed by at least one conductor in a node but which contains no cell which has a pin which is part of that node. The second quality criterion is the sum of the number of rows spanned by all of the nodes which connect to the logic cells it is proposed to exchange. The number of rows spanned by a node is also referred to as the y-span of the node. Where the rows are numbered sequentially from bottom to top, the y-span of a node is the number of the uppermost row on which that node has a pin minus the number of the lowermost row on which it has a pin. It is desired to minimize both the number of skipped rows in a node and the y-span of the node. Reducing the number of skipped rows is given a higher priority than reducing the y-span. The third quality citerion is a preference for reducing the length of the longest row in terms of the number of basic units in it which are connected into the circuitry of the IC. Shortening the longest row is given a lower priority than reducing the y-span of the nodes connected to a logic cell.

Most of the proposed cell exchanges turn out to be disadvantageous, a few are advantageous and some are indeterminate because the quality criteria have the same value for both the original and proposed cell assignments. Each time the pair exchange routine is invoked, it is executed repetitively until it no longer provides improvement. During the cell exchange process, there is a limit as to how much longer a row can become than the longest row at the beginning of that execution of the pair exchange routine. This limit is made tighter for each successive invocation of the pair exchange routine. During the final two invocations of the pair exchange routine, the limit is zero. The row length equalization routine is invoked after the completion of each pair exchange routine except for the last two invocations of the pair exchange routine. The row length equalization routine moves logic cells from long rows to short rows to make the length of all rows equal.

Once a final assignment of logic cells to rows has been achieved, this AUA software proceeds to the second phase of its logic cell assignment process. In this second phase the placement software moves logic cells within the row to which they are assigned in accordance with that phase's own quality criteria.

Because of the need for universal arrays with several thousand gates, automatic cell placement software is needed which places logic cells in such a large universal array in a manner which improves the ability of associated automatic routing software to achieve 100% routing of customizing conductors for high gate utilization, complex logic designs.

SUMMARY OF THE INVENTION

The present invention improves the automatic placement of logic cells in a universal array containing several thousand basic units through several improvements in the logic cell placement process. One improvement involves allocating unused basic units among the rows of the universal array in a manner which concentrates them in the rows whose associated wiring roadbeds tend to be congested. This reduces wiring density and enables associated automatic routing software to route 100% of the customizing conductors in that design even for high gate utilization designs. The unused basic units are preferably pyramidally distributed among the rows with the central rows having the most assigned unused basic units.

Another improvement involves inclusion of new quality criteria in the pair exchange routine. These new criteria are "excess of two" and "lengthen shortest row". The "excess of two" criterion seeks to minimize the total number of logic cells in excess of two on a row which contain pins of a given node and preferably follows y-span in priority. The "lengthen a shortest row" criterion seeks to lengthen the shortest row or any row within a tolerance of that shortest length and preferably has equal priority with shortening the longest row.

In the portion of the placement routine during which logic cells assigned to a row are positioned along that row, the unused basic units on that row are preferably spaced at intervals along that row to relieve wiring congestion during conductor routing. These unused basic units are preferably distributed evenly along each half of the row.

DETAILED DESCRIPTION OF THE PREFERRED EMBODIMENT

Figure 1:
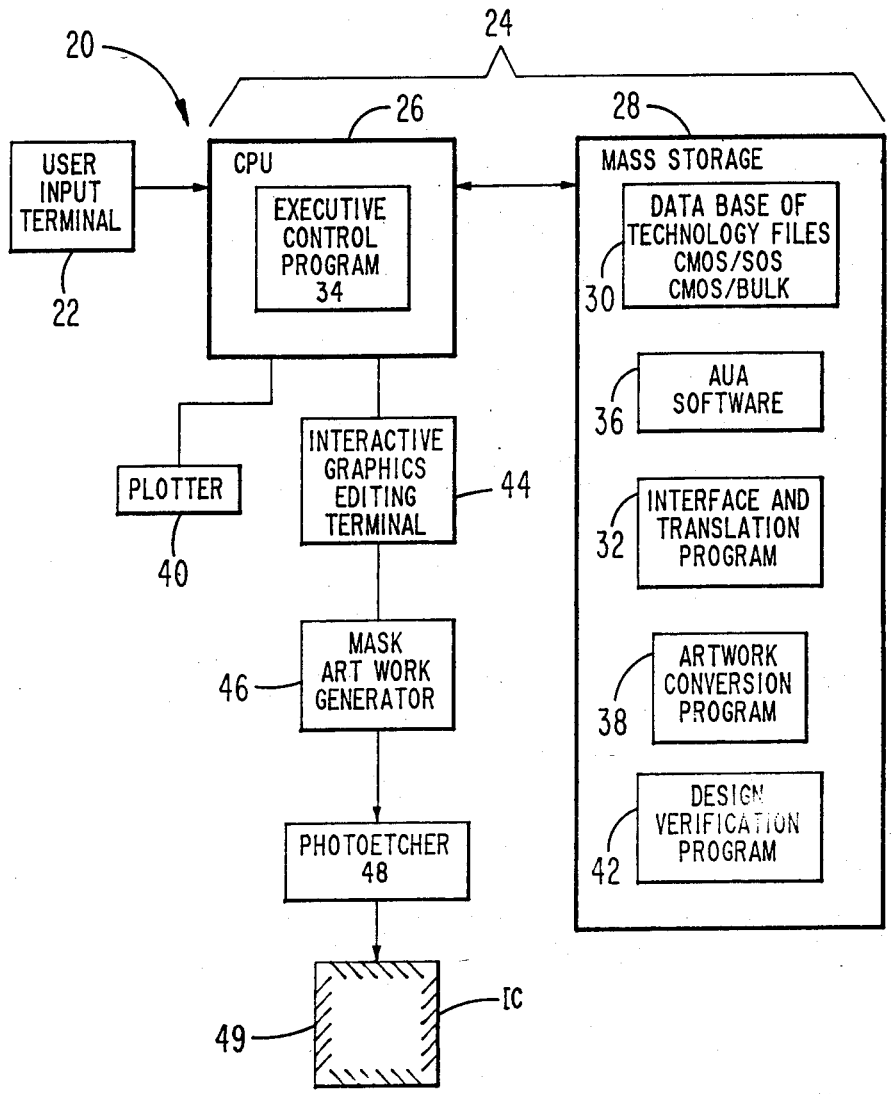
FIG. 1 illustrates in block diagram form a prior art computer aided design system which is improved by the present invention.

A computer aided design (CAD) system is illustrated generally at 20 in block diagram form in FIG. 1. CAD system 20 comprises an input system 22 through which the user's chip definition is entered. A data management and control system 24 comprises a central processing unit (CPU) 26 and a storage system 28. Storage system 28 includes files containing a data base 30 which includes one technology file for an AUA array in CMOS/SOS and another technoloy file for the AUA array in bulk CMOS. CMOS is an acronym for Complementary Metal Oxide Silicon circuitry. SOS is an acronym for Silicon On a Sapphire substrate and is used to refer to a semiconductor on any electrically insulating substrate. Bulk refers to circuitry in a single body of semiconductor material. The storage system includes a number of programs which are transferred to the CPU as needed. One of these is an interface and translation program 32. Under the control of a control executive 34, the interface and translation program combines the user's input and the AUA technology file for the selected technology into a placement and routing file containing the user specified logic cells and their pin interconnections. The AUA automatic placement and routing program operates on this file. The AUA software 36 then places the logic cells and routes the customizing conductors contained in that file.

The output from the AUA automatic placement and routing software 36 is a definition of a customizing mask in the Banning Artwork Language. An artwork conversion program 38 converts this mask definition into a form which is appropriate to drive a plotter 40, a design verification program 42, and an interactive graphics editing system 44. The plotter 40 is used to provide a hard copy which the designer can review. The design verification program 42 checks the design to be sure that the defined mask will actually provide the connections it is supposed to provide and does so without introducing any connections it should not and without violating any of the design rule for the universal array—that is line widths, spacings and so forth. The interactive graphics editing system 44 may be used to edit the mask design to correct any design errors which have been identified. The output of the interactive graphics editor 44 is provided to an artwork mask generating system 46 which controls the generation of the physical pattern of the mask. The resulting mask is used in a photoetching system 48 to customize AUA wafers to create the desired IC 49.

The present invention is an improvement on the AUA automatic placement and routing software used in the computer aided design system described above. The present invention is particularly suitable for use in automatic placement of logic cells in universal arrays having the structure which is the subject of the patent application entitled VARIABLE GEOMETRY AUTOMATED UNIVERSAL ARRAY by Richard Noto, Ser. No. 475,511, filed Mar. 11, 1983, now U.S. Pat. No. 4,568,961 which is assigned to the present assignee. That application is incorporated herein by reference. Automatic placement and routing software incorporating the present invention is available from the United States Army's Electronic Research and Development Command (ERADCOM), Fort Monmouth, N.J. under the name "VGAUA" or "2700 gate AUA", version 1.3. That VGAUA software is incorporated herein by reference. VGAUA stands for Variable Geometry Automated Universal Array. The variable geometry portion of this name is a result of designing both the array structure and the design software to enable the size of the array to be changed by changing parameters in the software, rather than having to re-write the software from scratch for each new array size.

Figure 2:
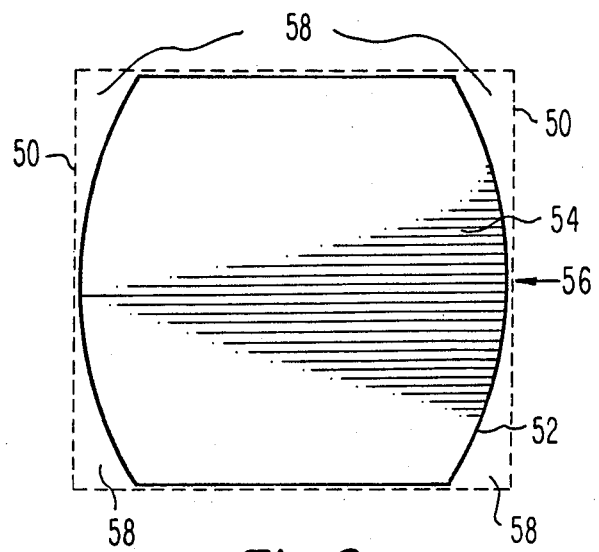
FIG. 2 illustrates graphically the number of used basic units per row in a typical prior art universal array designed using automatic placement and routing software.

FIG. 2 illustrates graphically the manner in which prior art automatic cell placement processes distributes used or active basic units and unused basic units within the row region of a universal array. The dashed rectangular outline 50 represents the boundaries of the row region of a universal array. In this illustration, any unused basic units are bunched at the ends of rows independant of where they are located on that row in the actual design. The line 52 encloses a region 54 which contains all of the active basic units and excludes all of the unused basic units in this bunched configuration of the universal array. The vertical portions of line 52 are convex and the region 54 has the general shape of a barrel. Essentially all of the unused basic units are bunched near the top and bottom corners 58 of the row region. In the rows near the center row 56 of the row region, essentially all of the basic units are active. Since active basic units must have wires connected to them and unused basic units do not require any wires connected to them, this distribution of active and inactive basic units results in wiring congestion in the central portion of the row region.

Usually when an automatic routing process fails to route one or more of the conductors needed to complete the customization of a universal array, each of the failed conductors needs to connect to a pin in this central portion of the row region where the wiring congestion is highest.

In accordance with the present invention, the complexity of circuit designs which can be successfully formed by customization of a given universal array is increased by reducing both active basic unit congestion and the wiring congestion in the central portion of the row region. This reduction of central portion congestion is achieved by restricting the distribution of unused basic units within a universal array. Active and inactive basic units are assigned to rows in accordance with the distribution which is graphically illustrated in FIG. 3.

Figure 3:
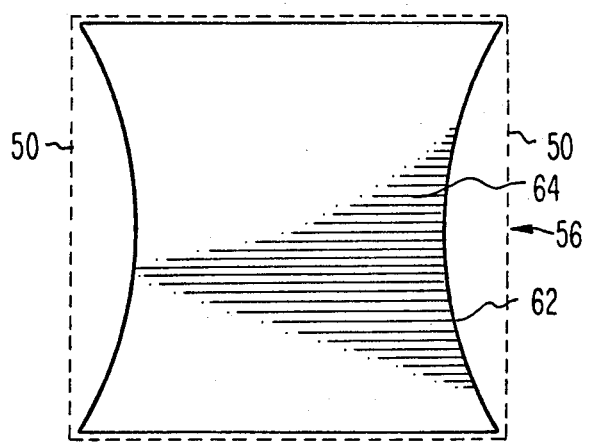
FIG. 3 illustrates graphically the number of used basic units per row in a typical universal array designed using automatic placement and routing software which incorporates the present invention.

FIG. 3 is similar to FIG. 2 except that in FIG. 3 the vertical portions of the solid line 62 which surrounds the region 64 which encloses all of the active basic units and excludes all of the inactive basic units are concave rather than convex. Thus, the distribution of unused basic units in FIG. 3 is more concentrated toward the center row 56 of the row region than toward its corners 58. This distribution is referred to as an "inverse barrel".

This distribution of unused basic units results from assigning most or all of the unused basic units to specific rows. Units which are assigned to rows can not be moved off of the row during the logic cell placement process. It is preferred to leave some small percentage, such as 10%, of the unused basic units unassigned so that they may be moved by the placement software during the phase one operation of moving logic cells between rows to optimize the quality criteria.

Figure 4A:
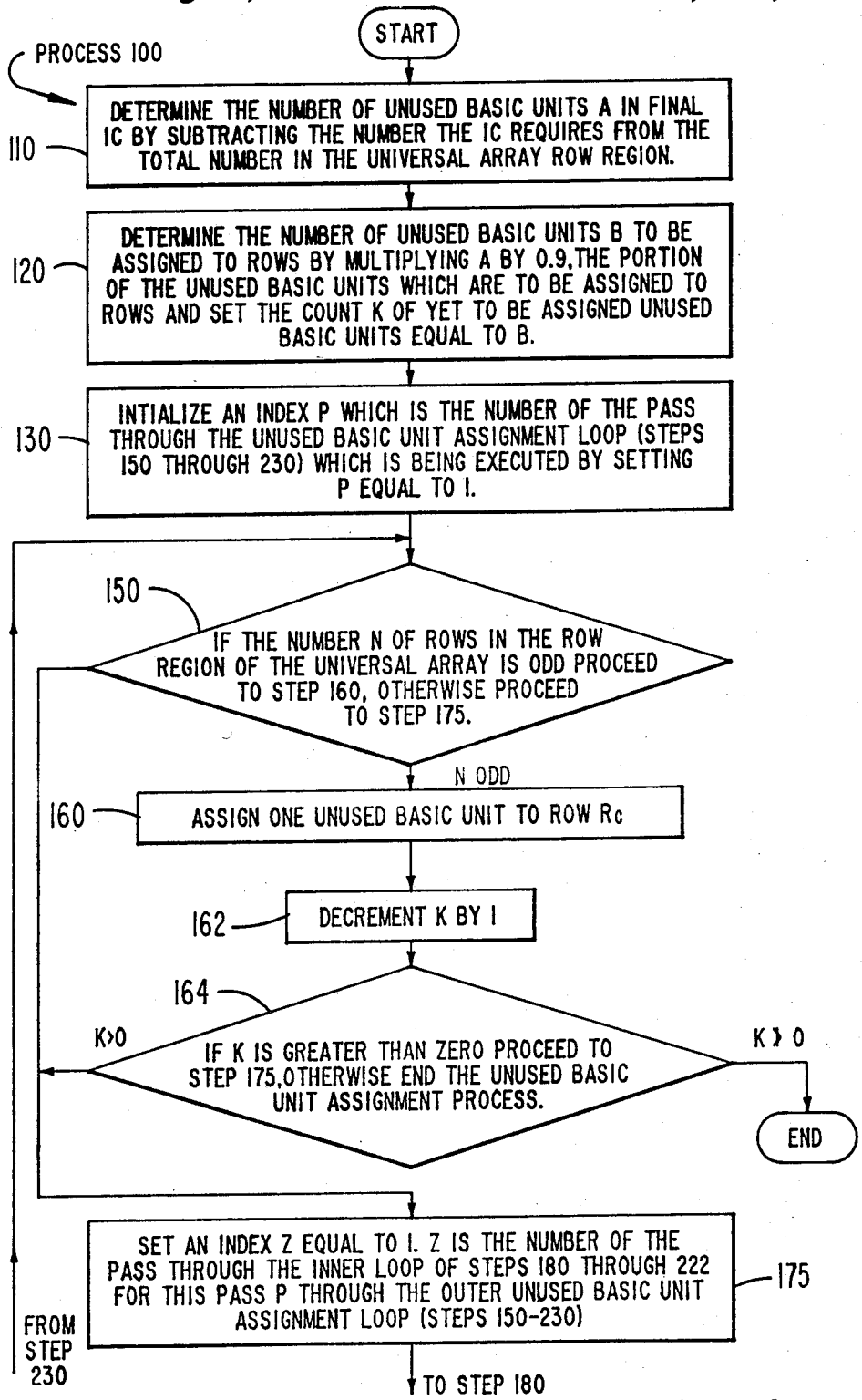
FIGS. 4a and 4b illustrate a preferred process for assigning unused basic units to rows.
Figure 4B:
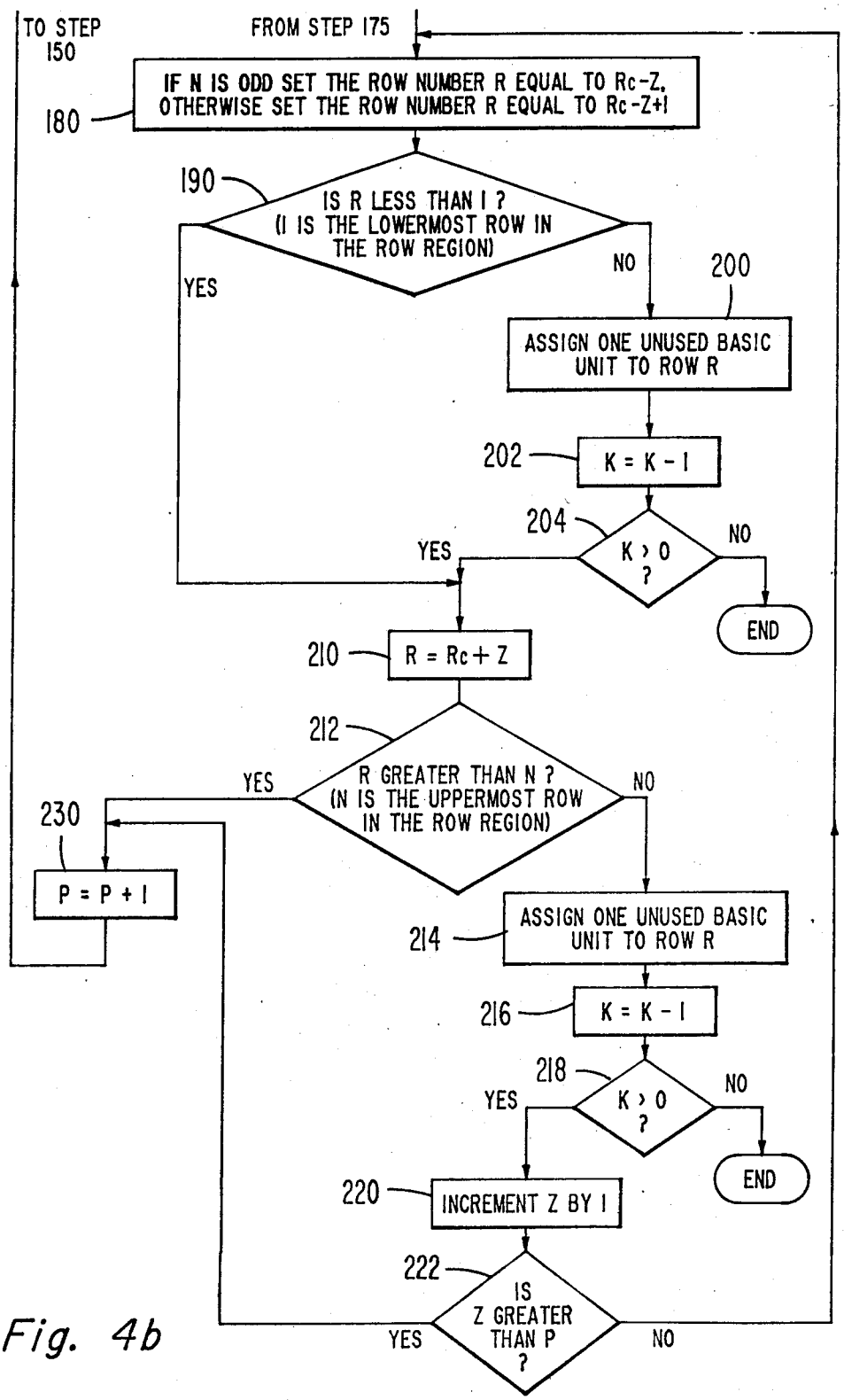

A preferred process 100 for achieving this desired inverse barrel distribution is illustrated in flow chart form in FIG. 4. Step 110 determines the number A of unused basic units which will be present in the final IC by subtracting the number of active basic units which the IC requires for its implementation from the total number of basic units in the row region of the universal array.

Step 120 determines the number B of these unused basic units which will be assigned to specific rows during this process by multiplying A by percentage (90%) to be assigned to rows. A count K is set equal to the number of unused basic units B to be assigned to specific rows. The count K is the number of unused basic units still to be assigned to specific rows and is decremented by 1 each time this process assigns an unused basic unit to a specific row.

Step 130 initializes an index P by setting it equal to one. The index P is the number of the pass through the outer unused basic unit assignment loop (steps 150-230) which is presently in progress. The value of this index determines the maximum number of rows to which unused basic units can be assigned in that pass. This is discussed in more detail in connection with steps 180-222.

Step 150 is a branch point in the unused basic unit assignment loop. If the total number N of rows in the row region of the universal array is even, the process proceeds directly to step 175. If the total number N of rows in the row region of the universal array is odd, the process executes steps 160, 162, and 164 before proceeding to Step 175.

Step 160 assigns an unused basic unit to the center row Rc of the cell row region. Step 162 decrements K by 1 so that K remains the number of unused basic units still to be assigned to rows. Step 164 tests K to see whether it is greater than zero. If K is not greater than zero, the unused basic unit assignment process ends. If K is greater than zero, the process proceeds to step 175.

At step 175, the two branches of the process merge. Step 175 initializes an index Z to 1. Index Z is the number of the pass through the inner assignment loop comprising steps 180 through 222 for the present pass P through the outer unused basic unit assignment loop of steps 150 through 230. If the number of rows N is odd, then step 180 sets the row number R equal to $Rc - z$, where Rc is the number of the center row. If N is even, then there is no center row. Instead, there are two rows which are closest to the center. When N is even, Rc is defined as the one of those two closest-to-the-center rows which is below the center and step 180 sets the row number R equal to $Rc - Z + 1$. In this way, when Z is 1, the row number R in step 180 is set to the number of the row which is just below the center of the row region, independent of whether N is odd or even.

Step 190 tests the row number R to see if it is less than 1 (row number 1 is the lower most row in the row region). If R is less than 1, then no unused basic unit should be assigned to row R and the process proceeds to step 210. If R is not less than one, then the process proceeds to step 200. Step 200 assigns an unused basic unit to the row R. Since another unused basic unit has just been assigned to a row, step 202 decrements K by 1 so that K remains the number of unused basic units still to be assigned to rows. Step 204 tests K to see whether it is greater than zero. If K is not greater than zero, the assignment process ends. If K is greater than zero, the process proceeds to step 210.

Step 210 sets the row number R equal to $Rc + Z$. This is the row directly above center when Z is 1. Step 212 tests R to see if R is greater than N (row number N is the uppermost row in the row region). If R is greater than N, then no unused basic unit should be assigned to row R and the process proceeds to step 230 where P is incremented by 1 prior to beginning another pass through the outer unused basic unit assignment loop of steps 150 through 230. If R is not greater than N, then the process proceeds to step 214. Step 214 assigns an unused basic unit to row R. Step 216 decrements K by 1 and step 218 tests K to see whether it is greater than zero. If K is not greater than zero, then all of the unused basic units to be assigned to rows by this process have been assigned to rows and the assignment process ends. If K is greater than zero, the process continues with step 220.

Step 220 increments Z by 1 in preparation for another pass through the inner assignment loop of steps 180 through 222. Step 222 checks to see if Z's new value is greater than P. If Z is not greater than P, then the process returns to step 180 for another pass through the inner assignment loop (steps 180 through 222). In this new pass through steps 180-222, Z has a larger value than it had during the previous pass. As a result, the values of the row number R are different and the unused basic units which are assigned on this pass through steps 180-222 are assigned to different rows than in the previous pass. If in step 222 Z is greater than P, then the inner loop has been completed for the present value of P and the process continues with step 230.

Step 230 increments P by 1 in preparation for another pass through the outer assignment loop of steps 150 through 230. During this new pass through the outer assignment loop, P has a larger value than during the previous pass. As a result, the upper limit on Z in step 222 is larger and more passes are made through the inner assignment loop (steps 180-222)on this pass through the outer loop than were made on the previous pass through the outer loop.

The unused basic unit assignment process 100 continues to assign unused basic units to rows until the total number, B, of unused basic units to be assigned has been assigned to rows. At that point K equals zero and the assignment process ends.

Figure 5:
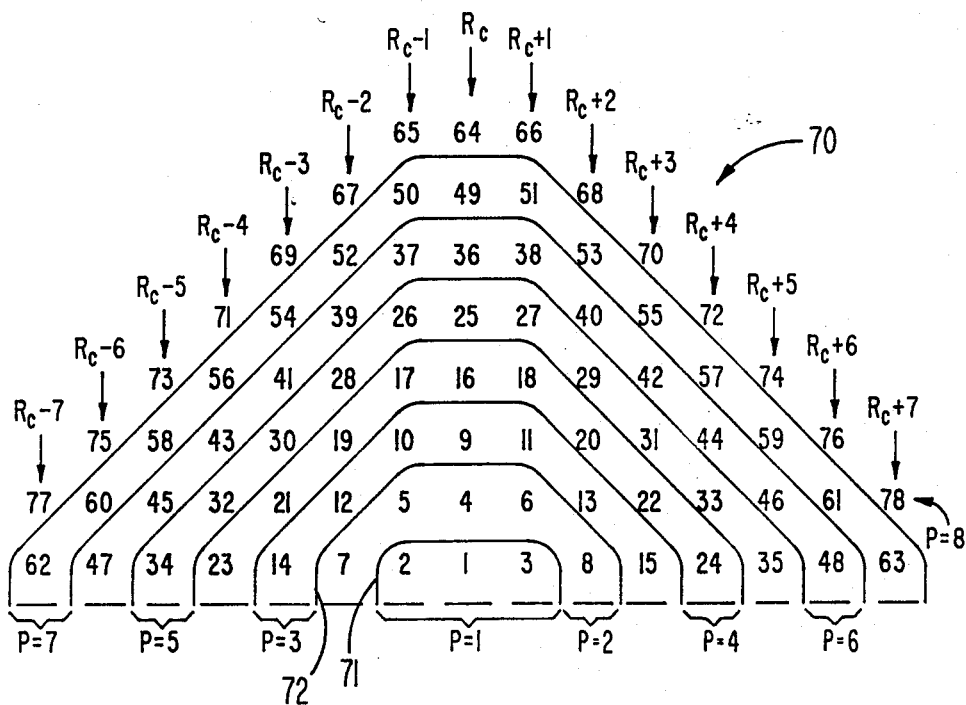
FIGS. 5 and 6 illustrate pyramids showing the distribution of unused basic units among the rows in row regions having odd and even numbers of rows, respectively.
Figure 6:
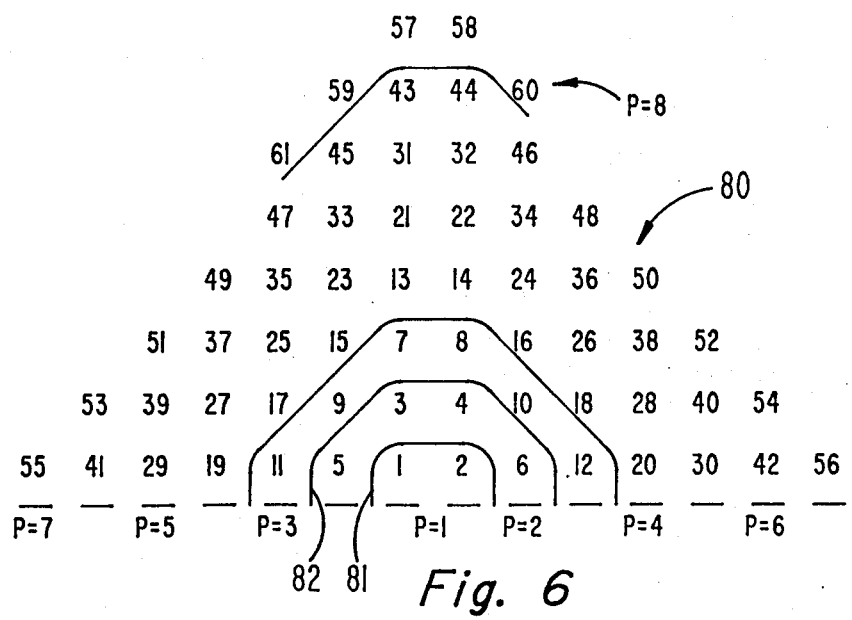

The order in which this process assigns the unused basic units to the rows in shown FIGS. 5 and 6. The pyramid 70 in FIG. 5 shows the assignment order when the number of rows N is odd. The numbers which form the pyramid 70 are the order in which unused basic units are assigned to rows. Row assignments in the universal array are in accordance with the columns in FIG. 5. During the first pass (P=1) through the outer assignment loop three unused basic units are assigned to rows. The first (the number 1) is assigned to the center row Rc by step 160, the second (the number 2) is assigned to the row below center (Rc−1) by step 200 and the third (the number 3) is assigned to the row above center (Rc+1) by step 214. The line 71 separates these three unused basic units which are assigned on pass P=1 from those which are assigned on later passes. The second pass through the outer loop (P=2) assigns the unused basic units numbered 4 through 8 in FIG. 5. Unused basic unit #4 is assigned by step 160 on pass P=2. Unused basic unit #5 is assigned by step 200 when P=2 and Z=1. Unused basic unit #6 is assigned by step 214 when P=2 and Z=1. Unused basic unit #7 is assigned by step 200 when P=2 and Z=2. Unused basic unit #8 is assigned by step 214 when P=2 and Z=2. The line 72 separates the unused basic units assigned during pass P=2 through the outer loop from those unused basic units assigned later. This progression of unused basic unit assignments proceeds until all of the unused basic unit to be assigned have been assigned.

The pyramid 80 in FIG. 6 shows the assignment order when the number of rows-N is even. The unused basic units in pyramid 80 are assigned to the rows in the same manner as those in pyramid 70, except that step 160 is not executed during that process because N is even. All unused basic unit assignments are made by steps 200 and 214. Thus, one less unused basic unit is assigned for each value of P for N even than are assigned for N odd. The lines 81 and 82 are similar to lines 71 and 72 in separating those unused basic units assigned when P=1 and P=2 from subsequently assigned unused basic units, respectively. Thus, the unused basic unit assigned for each value of P are located between two of the separating lines.

If the number B of unused basic units to be assigned to rows is larger than the number of basic units present in the pyramid 70 or 80 when that pyramid has as many (N) occupied columns as there are rows in the array, then the assignment process continues assigning additional unused basic units to rows of the array one at a time in the center outward order established by process steps 150 through 222. That process can add complete extra layers such as the top layer containing basic units number 64 through 78 of pyramid 70 in FIG. 5 which is generated with P=8. Such a configuration is pyramidal because it has a greater number of basic units assigned to rows near the center of the the row region than it has assigned to the outermost rows of that region. Normally, at the time K becomes zero and the process ends there is an incomplete layer, such as the partial layer containing basic units number 57 through 61 of pyramid 80.

This distribution scheme results in a smooth decrease in the number of unused basic unit assigned to a given row as the number of rows between the given row and the center row increases.

If desired, other distribution schemes may be used assigning the unused basic units to rows, including ones which do not result in smooth decreases in the number of basic units assigned to successive rows and ones which are flat in that they assign the same number of unused basic units to each row to the extent possible.

The desire that a given number of unused basic units remain on a specific row can be effected in two ways. First, the inclusion of these unused basic units on a row can be effected by providing the phase one placement software with fictitious row lengths which are equal to the actual number of basic units in each row minus the number of unused basic units assigned to that row. Second, the unused basic units can be assigned to the rows on a fixed distribution basis which prevents the placement software from moving them off of the row to which they are assigned. Either of these techniques produces the same limit on the number of active basic units which the phase one software can place on a row. Thus, the choice between these techniques depends on the other characteristics of the phase one software.

Where the row assignments are done by the use of fictitious row lengths, the fictitious row lengths are discarded once the phase one portion of this placement process is complete The phase two process then works with the actual row lengths. Since the phase two portion of this process does not move cells between rows, the assignment of the unused basic units is permanent. If a placement process moves logic cells along rows and between rows concurrently, then the assignment of unused basic units to rows is preferably done as a fixed distribution which the placement software is not permitted to change.

Figure 8A:
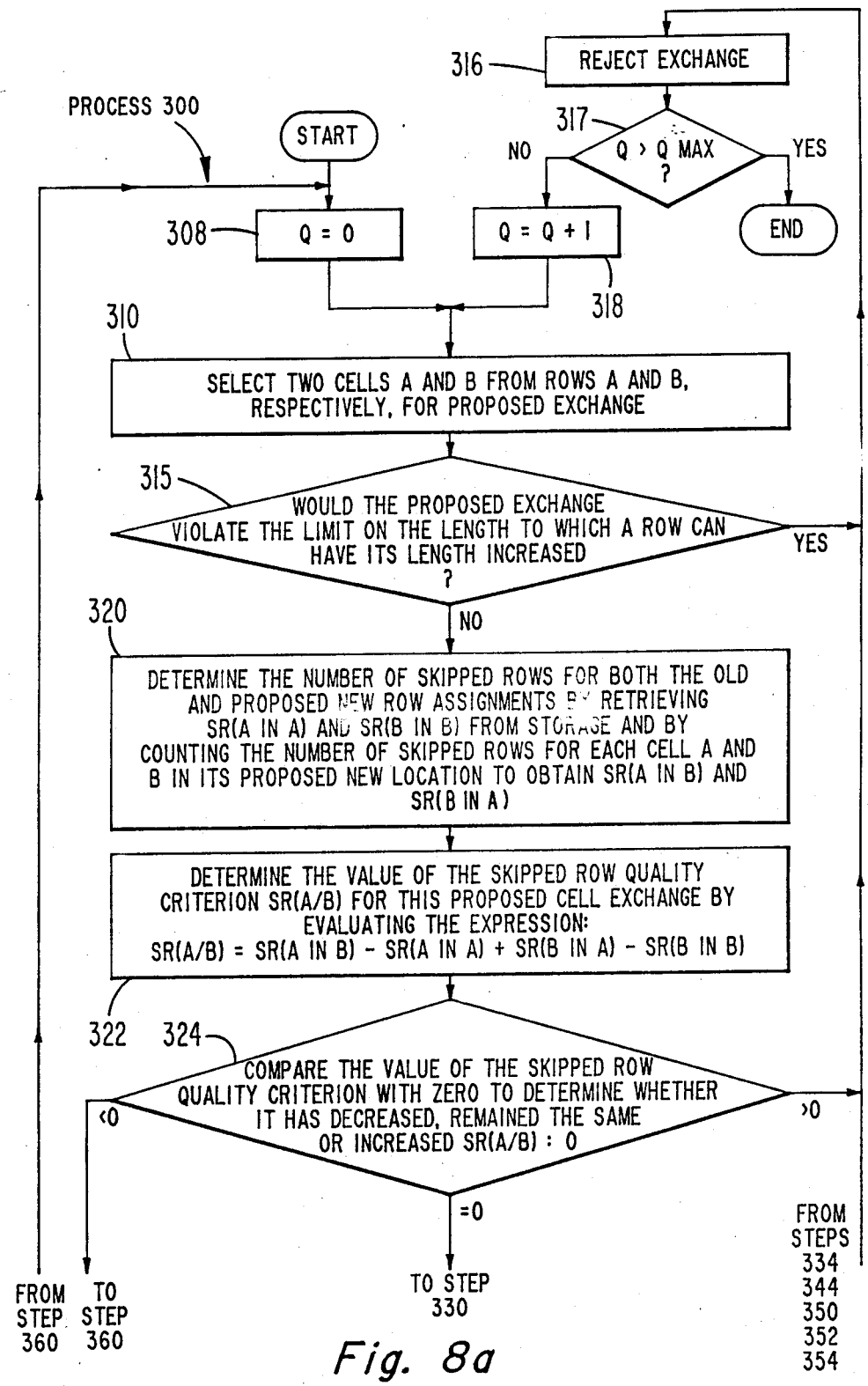
FIGS. 8a, 8b and 8c illustrate a preferred process for optimizing the distribution of logic cells among the rows.
Figure 8B:
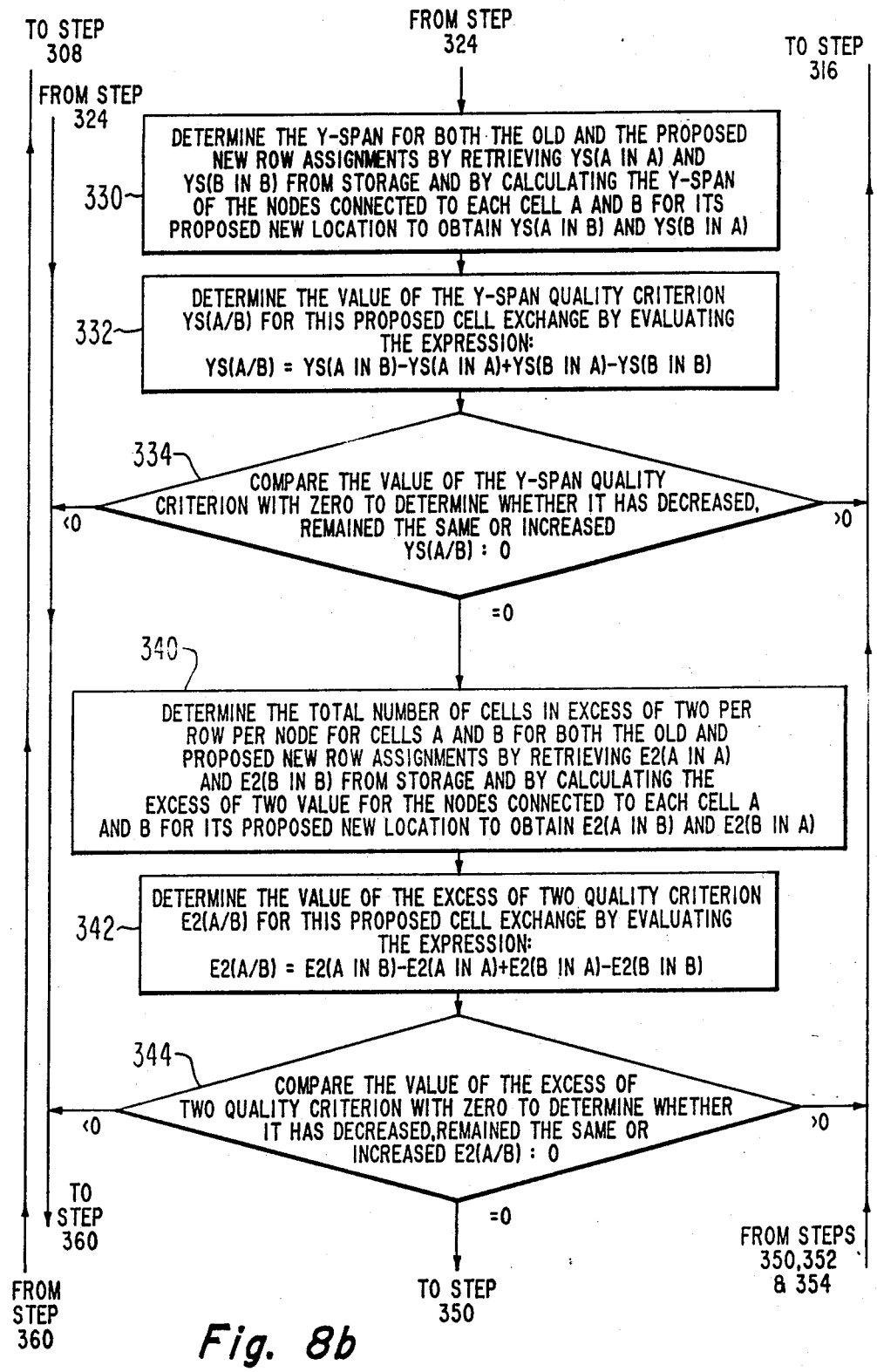
Figure 8C:
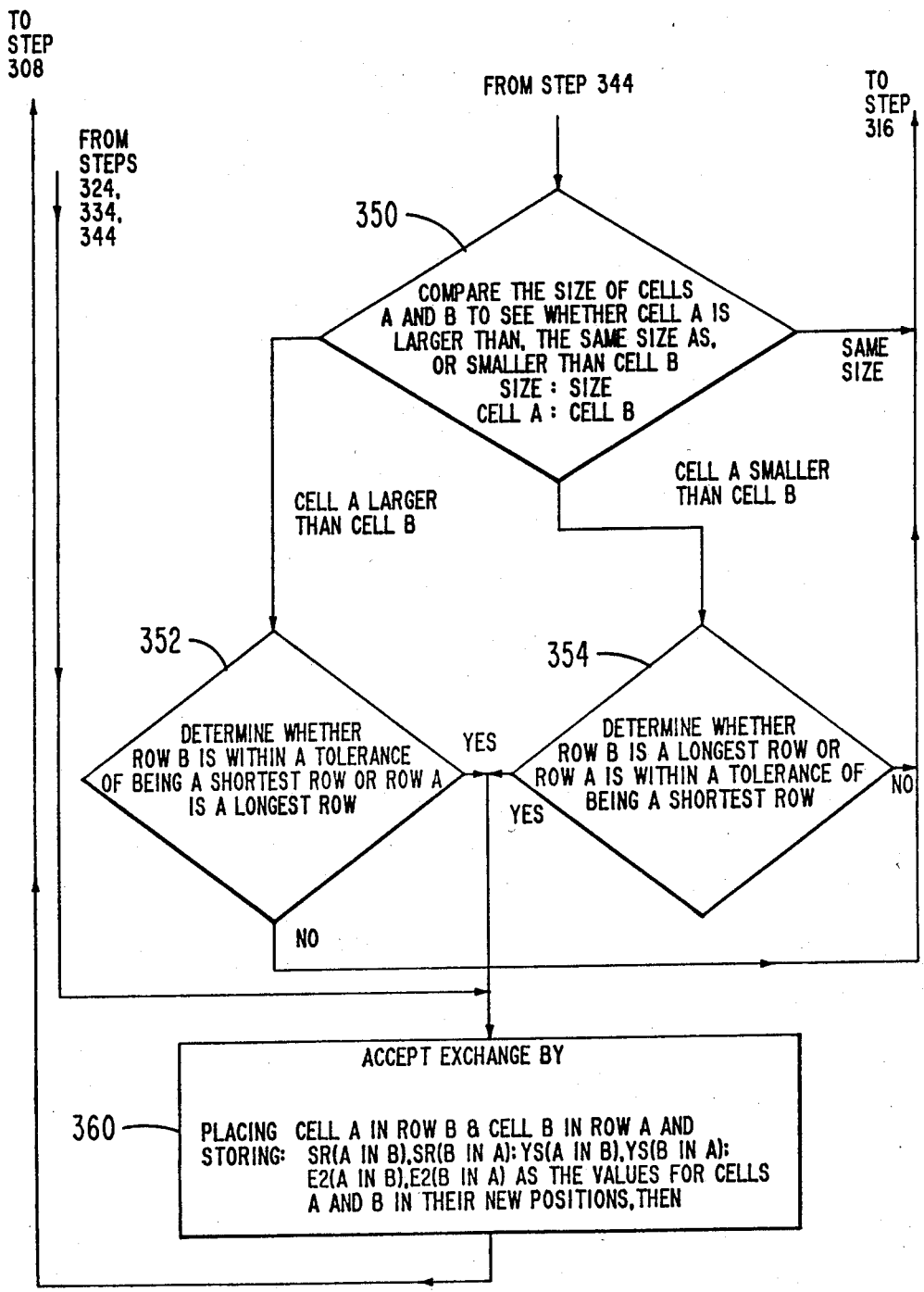

Following the assignment of unused basic units to the rows of the row region of the array, the logic cell placement process proceeds to the pair exchange stage A preferred process 300 for exchanging logic cells between rows is illustrated in FIG. 8. This process begins in step 308 by setting an index Q equal to zero. The value of the index Q is the number of consecutive pair exchange rejects Step 310 selects two logic cells A and B which are located in different rows as a logic cell pair for a proposed exchange. The cells for pair exchange can be selected in any order. During the course of the pair exchange process all pairs of cells not on the same row are selected. This selection is made in accordance with the prior art process. Logic cells can have any one of a number of different lengths depending on how many basic units are required for their implementation. Each of these lengths is an integer multiple (greater than zero) of the length of a basic unit. These lengths range from one basic unit for an inverter up to 7 basic units for a flip flop.

At the time the pair exchange process 300 is invoked, a limit is established on how long a row can become during the pair exchange process. This limit is reduced for each successive invocation of the process 300.

Step 315 checks the lengths of cells A and B and the length of the rows into which they would be moved to see if the proposed exchange would violate the limit on the maximum length of a row. If the proposed exchange would violate this limit, then the process proceeds to step 316. Step 316 rejects the proposed exchange. Step 317 compares the value of Q with a maximum value Qmax. If Q is less than Qmax, then step 318 increments Q by 1 and returns the process to step 310 for the selection of a new pair of cells. If Q is greater than Qmax, then step 317 ends the this execution of the pair exchange process.

In the course of analyzing the quality of this proposed exchange of logic cells A and B, this process determines several parameters for both the original locations and the proposed new locations of the logic cells to be exchanged. In order to keep clear which parameter values are for the cells in their original positions and which are for the cells in their proposed positions, the row in which cell A is located at the time of its selection is referred to as row A and the row in which cell B is located at the time of its selection is referred to as row B. The quality criterion which determines whether the proposed exchange is an improvement is the overall change such an exchange would cause in the values of these parameters.

Figure 7:
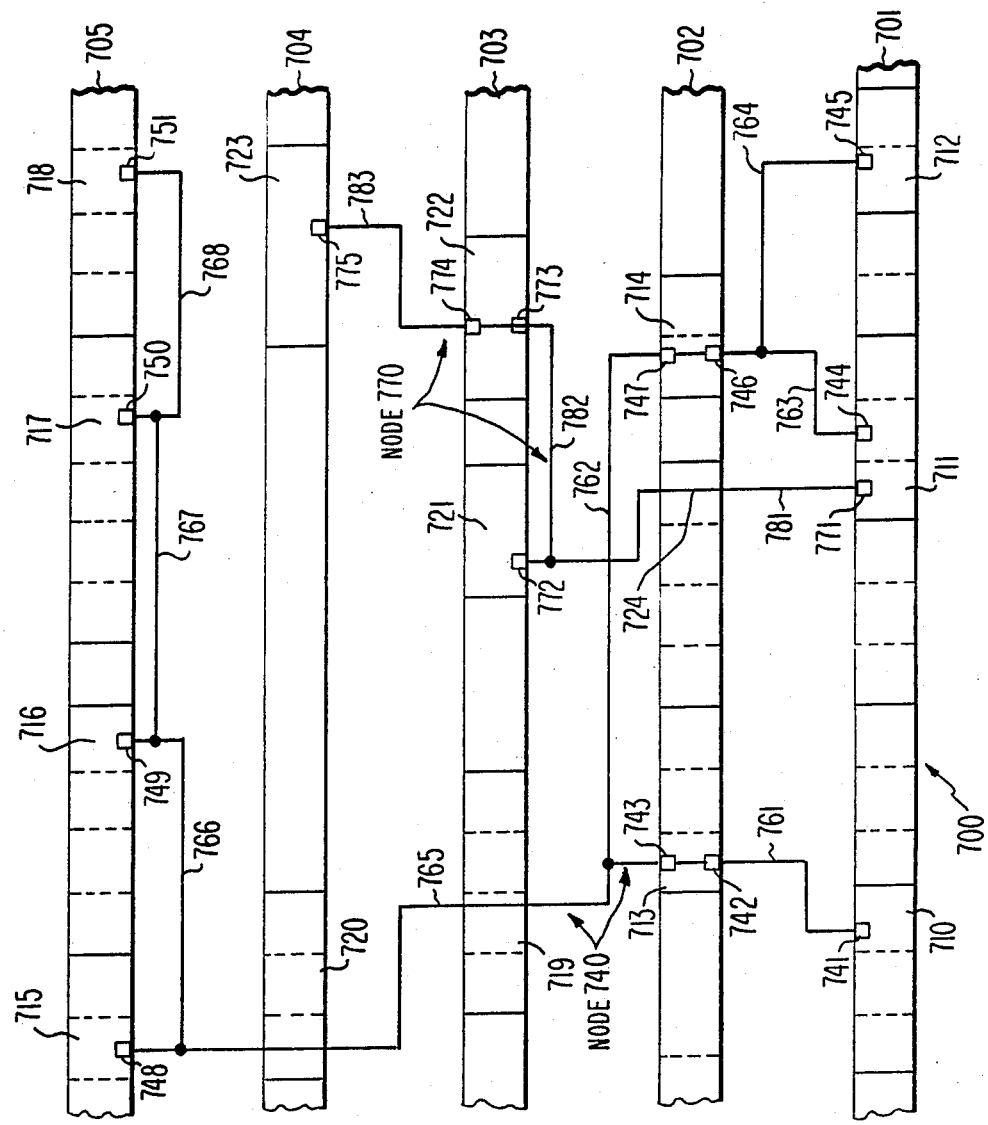
FIG. 7 illustrates five rows and two nodes which have logic cell pins on those rows.

FIG. 7 illustrates a portion 700 of a row region of universal array. Five rows 701-705 of basic units are included in portion 700. Two nodes 740 and 770 are illustrated. A node is a set of pins of active basic units all of which must be connected together by conductors and those connecting conductors. All of the conductors and pins of a node are at the same electrical potential. Node 740 includes logic cell pins 741-751 and conductors 761-768. Node 740 connects to pins in logic cells 710-718. Node 770 includes logic cell pins 771-775 and conductors 781-783. Node 770 connects to pins of logic cells 711 and 721-723. A row which is crossed by at least one conductor in a node but which contains no active basic unit pin which is part of that node is a skipped row for that node. Conductor 765 of node 740 crosses row 703 at cell 719 and row 704 at cell 720. Since none of the cells to which node 740 connects are located on rows 703 or 704, rows 703 and 704 are skip rows for node 740. Conductor 781 of node 770 crosses row 702 at cell 724. Since none of the cells to which node 770 connects are located on row 702, row 702 is a skip row for node 770.

The first of the quality criteria evaluated by process 300 is, SR(A/B), the change in the total number of skipped rows in the nodes to which the cells to be exchanged connect. Step 320 determines the value of the skipped row parameter for each cell in both its original and its new position. When cell A is in row A, the total number of skipped rows in the nodes connected to pins of cell A is symbolized by SR(A in A). When cell A is in row B, the total number of skipped rows in the nodes connected to pins of cell A is symbolized by SR(A in B). When cell B is in row B, the total number of skipped rows in the nodes connected to pins of cell B is symbolized by SR(B in B). When cell B is in row A, the total number of skipped rows in the nodes connected to cell B is symbolized by SR(B in A).

The values of SR(A in A) and SR(B in B) are retrieved from storage and the value of SR(A in B) is determined by counting the number of skipped rows for each node to which cell A connects with cell A in row B. The value of SR(B in A) is determined in a similar manner.

Step 322 determines the skipped row quality criterion's value, SR(A/B), for this proposed cell exchange by evaluating the expression:

$$SR(A/B) = SR(A \text{ in } B) - SR(A \text{ in } A) + SR(B \text{ in } A) - SR(B \text{ in } B).$$

Step 324 compares this value of SR(A/B) with zero and directs the process into one of three branches in accordance with L the results of that comparison. If SR(A/B) is less than zero, then the process jumps to step 360 to accept the proposed exchange of cells A and B. If SR(A/B) is greater than zero, then the process proceeds to step 316 which rejects the proposed exchange of cells A and B and passes the process to step 317. If SR(A/B) is zero, the exchange is a wash as far as the skipped row quality criterion is concerned and the process proceeds to step 330 to make a decision based on the y-span quality criterion.

The y-span for a node is defined as the number of the uppermost row which contains a cell of that node minus the number of the lowermost row which contains a cell of that node. Rows are numbered sequentially from bottom to top. In FIG. 7, node 740 has a y-span of four (705 minus 701). Node 770 has a y-span of three (704 minus 701).

Step 330 determines the value of the y-span parameter for each cell in both its original and its new proposed position. The values of the y-span parameter ror the four cell locations are symbolized by YS(A in A), YS(A in B), YS(B in B), and YS(B in A). The values of YS(A in A) and YS(B in B) are retrieved from storage and the value of YS(A in B) is determined with cell A in row B by counting the number of skipped rows for each node to which cell A connects. The value of YS(B in A) is determined in a similar manner.

Step 332 determines the y-span quality criterion's value, YS(A/B), for this proposed cell exchange by evaluating the expression:

$$YS(A/B) = YS(A \text{ in } B) - YS(A \text{ in } A) + YS(B \text{ in } A) - YS(B \text{ in } B).$$

Step 334 is like step 324 and compares the value of YS(A/B) with zero and directs the process into one of three branches in accordance with the results of that comparison. If YS(A/B) is less than zero, then the process jumps to step 360 to accept the proposed exchange of cells A and B. If YS(A/B) is greater than zero, then the process proceeds to step 316 which rejects the proposed exchange of cells A and B and passes the process on to step 310 for selection of another cell pair for exchange evaluation. If YS(A/B) is zero, the exchange is a wash as far as the y-span quality criterion is concerned and the process proceeds to step 340 to make a decision based on the excess-of-two quality criterion.

The excess-of-two parameter for a node is defined as the sum of the number of cells in that node in excess of two on each row on which that node has a cell. Thus, the contribution of a row is zero if there are none, one or two cells of that node on that row. If there are three or more cells of that node on a row, then that row contributes a value which is equal the number of those cells minus two. The value of this paramter for a cell when in a given row is the sum of these values over all rows for all nodes which connect to pins of that cell. In FIG. 7, node 740 has three cells on row 701 (cells 710, 711, and 712) and thus has one cell in excess of two on row 701. Node 740 has four cells on row 705 (cells 715, 716, 717, and 718) and thus has two cells in excess-of-two on row 705. The excess-of-two parameter for node 740 is thus three (one plus two). Node 770 has an excess-of-two parameter of zero since the most cells it has on any cell row is two.

Step 340 determines the value of the excess-of-two parameter for each cell in both its original and its new proposed position. The values of the excess-of-two parameter for the four cell locations are symbolized by E2(A in A), E2(A in B), E2(B in B), and E2(B in A). The values of E2(A in A) and E2(B in B) are retrieved from storage and the value of E2(A in B) is determined with cell A in row B by counting the number of cells in excess of two on each row for each node which connects to a pin of cell A. The value of E2(B in A) is determined in a similar manner.

This excess-of-two criteria expresses a preference for a placement which reduces the total number of logic cells in excess of two per node on a row.

Step 342 determines the excess-of-two quality criterion's value, E2(A/B), for this proposed cell exchange by evaluating the expression:

$$E2(A/B) = E2(A \text{ in } B) - E2(A \text{ in } A) + E2(B \text{ in } A) - E2(B \text{ in } B).$$

Step 344 is similar to steps 324 and 334, and compares the value of E2(A/B) with zero and directs the process into one of three branches in accordance with the results of that comparison. If E2(A/B) is less than zero, then the process jumps to step 360 to accept the proposed exchange of cells A and B. If E2(A/B) is greater than zero, then the process proceeds to step 316 which rejects the proposed exchange of cells A and B and returns the process to step 317 in preparation for selection of another cell pair for exchange evaluation. If E2S(A/B) is zero, the exchange is a wash as far as the excess-of-two quality criterion is concerned and the process proceeds to step 350 to make a decision based on the row length criterion.

The process now proceeds to step 350 which compares the size of cells A and B to determine whether cell A is larger than, the same size as or smaller than cell B. If cell A is larger than cell B, then the process proceeds to step 352. If cell A is the same size as cell B, then the process proceeds to step 356. If cell A is smaller than cell B, then the process proceeds to step 354.

Step 352 checks the lengths of rows A and B. There may be more than one row which has the shortest length and/or more than one row which has the longest length. If row B has a length which is that of the shortest row or within a tolerance of that length or if row A has the length of the longest row, then the proposed exchange is consider advantageous and is accepted by going to step 360. The tolerance by which a row can be longer than a shortest row and still satisfy the row lengthening criterion is preferably less than five basic unit lengths. The exchange can be determined to be advantageous in step 352 either because it satisfies the prior art criterion of shortening the longest cell row or because it satisfies the new criterion of lengthening a row which is within a tolerance of being a shortest row. This new criterion results from the fact that there are fewer routing problems when the total length of the cells on adjacent rows are nearly equal. If neither of these criteria are satisfied, then the proposed exchange is rejected by going to step 316.

Step 354 also checks the lengths of rows A and B. If row A has a length which is that of the shortest row or within a tolerance of that length or if row B has the length of the longest row, then the proposed exchange is consider advantageous and is accepted by going to step 360. The exchange can be determined to be advantageous in step 354 for the same reasons as in step 532. If neither of these criteria are satisfied, then the proposed exchange is rejected by going to step 356.

Step 360 accepts the proposed exchange by placing cell B in row A and cell A in row B and storing the values of SR(A in B), SR(B in A), YS(A in B), YS(B in A), E2(A in B) and E2(B in A). These are the values for the new locations of cells A and B and are stored as referring to those cells in what is their present position after the acceptance of the exchange and are stored so that in future proposed cell exchanges involving these cells these values can be retrieved from storage.

This process is repeated until it produces Qmax consecutive pair rejections which is a sign that the process is no longer producing advantageous proposed cell exchanges. At that point, the row length equalization process is invoked to move logic cells from row to row to equalize the length of the cell rows. The pair exchange process is again invoked after the completion of the row length equalization process. The row equalization process is not invoked after either the last or the next to last invocation of the pair exchange process.

After completion of the final execution of the pair exchange process, the placement process proceeds from its phase one portion which has been concerned with which logic cells go on which row to its phase two portion which is concerned with where within the row the cells already allocated to that row should be placed.

FIG. 3 represents the desired distribution of active and inactive basic units among the rows of the row region. It does not represent the desired distribution of the unused basic units along the rows. Placement of the assigned unused basic units at the row ends would not provide any significant benefit over the prior art technique which results in most of the unused basic units ending up in the rows near the ends of the row region.

The unused basic units on a given row (both those assigned to it and any unassigned ones placed there by the phase one portion of the placement process) are preferably spaced along that row as a means of reducing the active basic unit congestion along the row. Reducing the active basic unit congestion along the rows has a beneficial effect on conductor routability. An unused basic unit has a built-in feedthrough in one wiring lane. This allows an extra conductor to cross a row there. This can relieve wiring congestion by reducing the distance that a conductor must be routed along the row to reach an available feedthrough. This frees the wiring channel used for that conductor from the feedthrough actually used in the unused basic unit to the feedthrough which would otherwise have had to have been used. In addition, the two basic unit conductors which would serve as the inputs to the basic unit if it were active can also be used as feedthroughs. These are preferably limited to emergency use in a universal array in which they are polysilicon conductors rather than metal conductors because of their resulting relatively high impedances.

Figure 10:
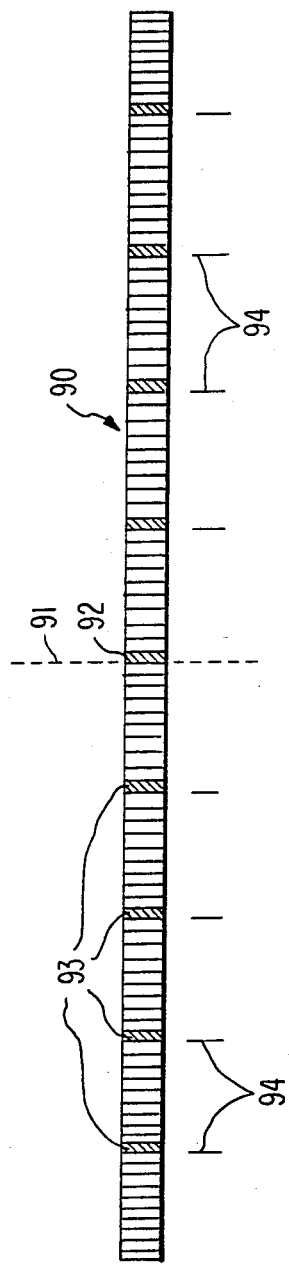
FIGS. 10 and 11 illustrate two different distributions of unused basic unit along rows in accordance with the anticipated wiring congestion.

Because of the resulting routing benefits, it is preferred to space the unused basic units at intervals along the row to which they are assigned. A preferred means of distributing unused basic units within a row is by tying each unused basic unit to a different fixed point. The term "tying" refers to an initial and default positioning of the unused basic unity at specific points. This prevents the unused basic units from being bunched at the ends of rows by the second phase of the placement process. The tying of the basic units to the fixed points is preferably elastic so that it allows the phase two process to move an unused basic unit some distance from its tie point if doing so provides a sufficient improvement in one of the phase two quality criteria. In the absence of such a benefit, the unused basic units remain fixed at their tie points. The ability to flexibly tie a basic unit to a given point is included in the prior art placement process. It is preferred to divide the row into two sections and divide the unused basic units on the row evenly between those sections. A row 90 which is divided into two sections at line 91 is illustrated in FIG. 10. Row 90 includes an odd number of unused basic units. One of these unused basic units 92 is tied to the division line 91. The remain unused basic units 93 are divided equally between the two halves of the row. Within each half, the unused basic units 93 are distributed at evenly spaced tie-down points 94. The tie-down points are spaced apart by many active basic units.

Figure 9A:
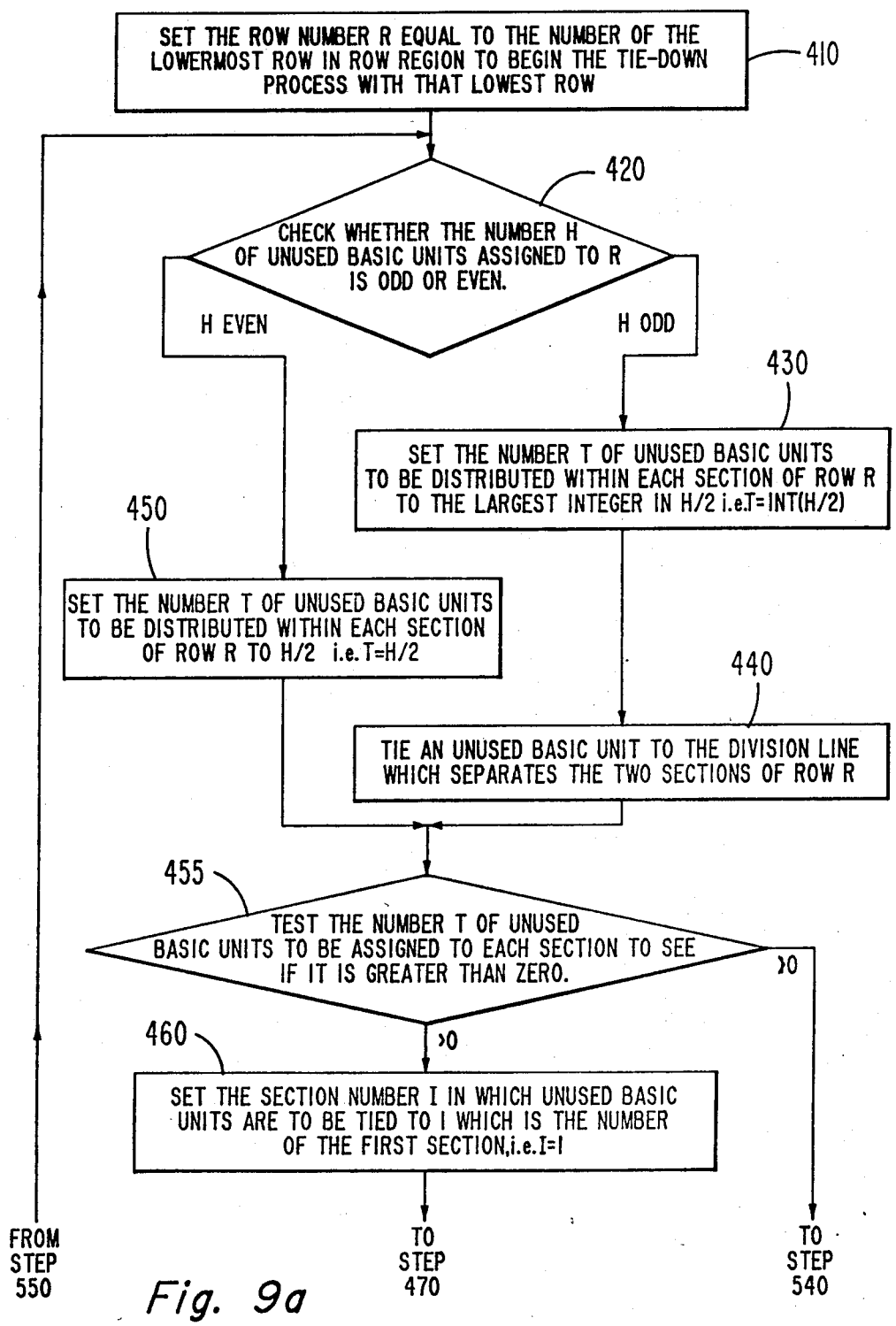
FIGS. 9a and 9b illustrate a preferred process for placing unused basic units at intervals along the rows.
Figure 9B:
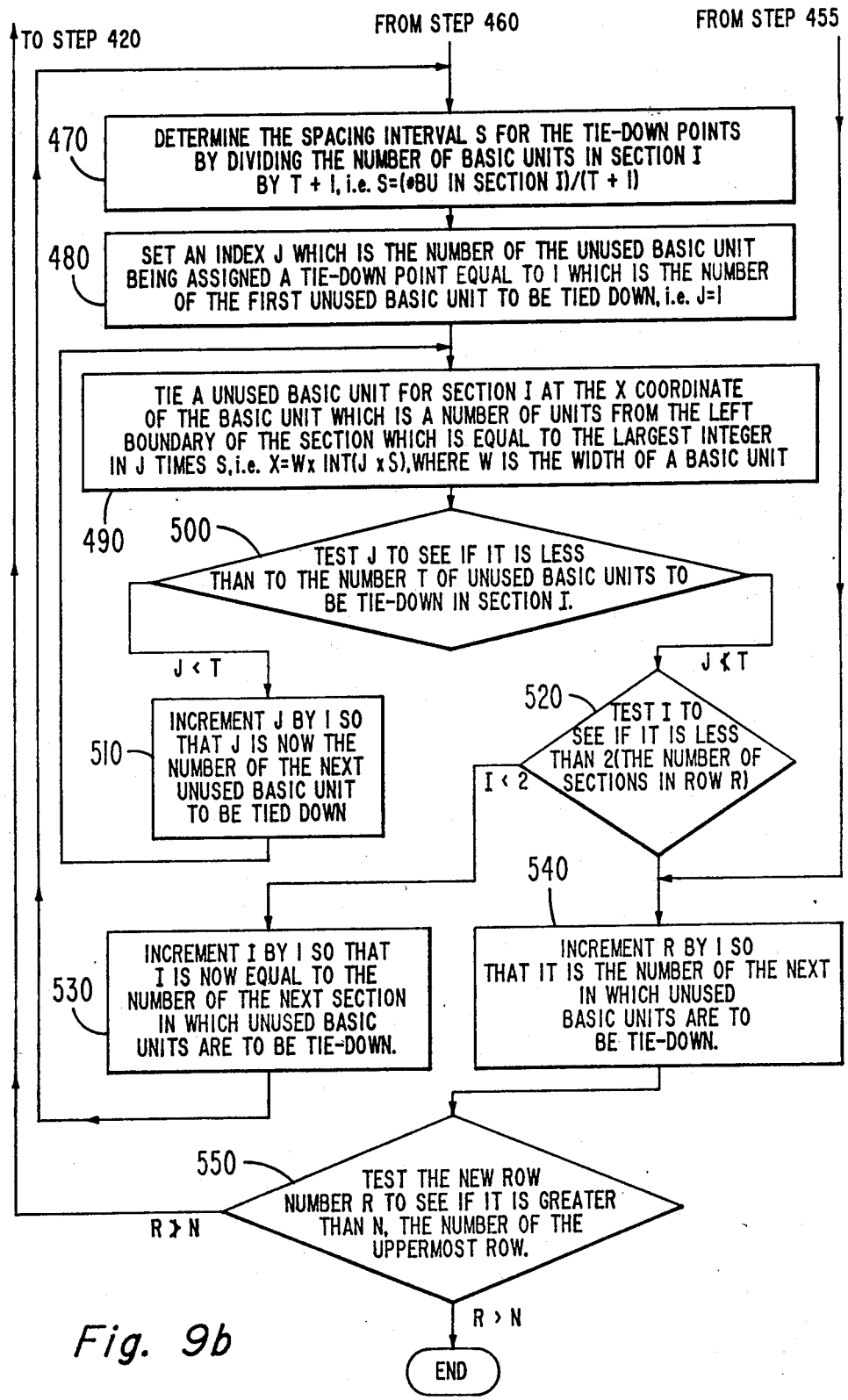

A preferred process 400 for tying down the unused basic units in this manner is illustrated in FIG. 9. This process begins with step 410 which initializes the row number R by setting it equal to 1 which is the number of the lowermost row in the row region. This causes the tie-down process to begin with that lowermost row.

Step 420 checks whether the number H of unused basic units to be assigned to row R is odd or even and directs the process into different branches in accordance with whether the number H is odd or even. If H is even, then the process proceeds to step 450. If H is odd, the process proceeds to step 430. Both step 430 and step 450 are devoted to establishing the number T of unused basic units which are to be assigned to each half of the row.

Since H must be odd for the process to take the branch which leads to step 430, this step sets the number T of unused basic units to be assigned to each half of the row equal to INT(H/2). INT is a function which returns the largest integer in its argument. Thus, T is set equal to the largest integer in H/2. This provides equal distribution of the unused basic units between the two sections and leaves one extra unused basic unit which will not be assigned to either section. Step 440 ties this extra unused basic unit to the division line which divides the row into its two sections.

If H is even, the process takes the branch which bypasses steps 430 and 440 and goes to step 450. Step 450 is like step 430 in that it sets the number T of unused basic units to be tied down in each section of the row. Since H must be even for the process to reach step 450, this step sets T equal to H/2 without use of the INT function.

The two branches of the process rejoin at step 455 which follows whichever of step 440 and 450 is executed in any given pass through this process. Step 455 checks whether T is greater than zero. If it is the process proceeds to step 460. If T is not greater than zero, then the process jumps to step 540 which increments the row number R.

Step 460 initializes a section number I by setting it equal to 1, the number of the first section of the row. The index I specifies which section of the row the subsequent portion of the process is working on.

Step 470 establishes the spacing interval S for the tie-down points in section I. The value of S is established by dividing the total number of physical basic units (#BU) in section I by the number of unused basic units in that section plus one (T+1). That is, S is (#BU)/(T+1).

Step 480 initializes an index J by setting it equal to 1. Index J is the number of the unused basic unit in the section I whose tie-down point is to be determined by the next execution of step 490 which is the step which follows step 480.

Step 490 ties an unused basic unit at the X coordinate W×INT(J×S) within section I, where W is the width of a basic unit.

Step 500 tests J to see if it is less than the number T of basic units to be tied down in section I. If J is less than T, then the process proceeds to step 510 in preparation for placing the tie point for another unused basic unit. If J is not less than T, then all of the unused basic units in section I have been tied to specific locations and the process proceeds to step 520.

Step 510 increments J by one and returns the process to step 490 to tie down unused basic unit J.

Step 520 tests to see if I is less than 2 which is the number of section in row R. If I is less than 2, then the process proceeds to step 530. If I is not less than 2, then the process proceeds to step 540.

When the process reaches step 530, the tying down of the unused basic units in section 1 of the row has been completed. Step 530 increments I by one to prepare the process for tying down the unused basic units in section 2 of the row.

When the process reaches step 540, I is equal to 2, and all of the unused basic units on row R have been tied to specific locations. Step 540 increments R by one in preparation for processing the placement of the next row's unused basic units. From step 540, the process proceeds to step 550.

Step 550 tests the new value of the row number R to see if it is greater than N, the number of the uppermost row in the row region. If R is greater than N, then the tie-down process ends because all rows have been processed. If R is not greater than N, then the process goes back to step 420 to begin determining tie-down points for the unused basic units on the new row R.

Figure 11:
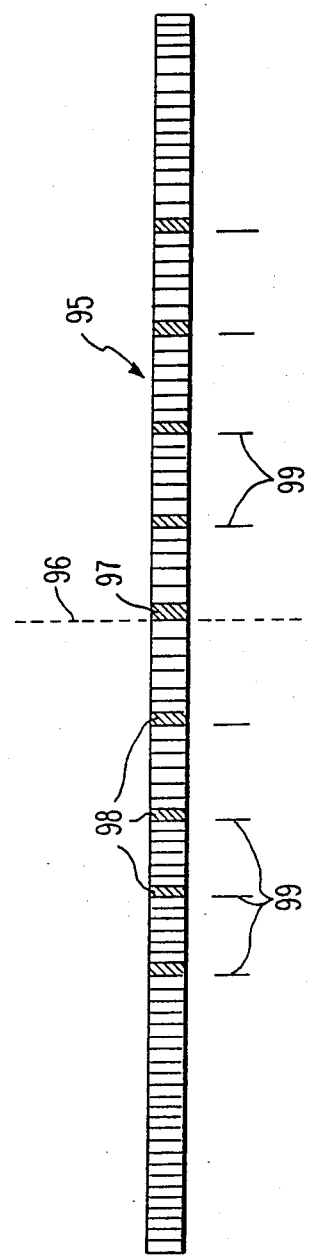

The objective of assigning unused basic units to particular rows and tying the unused basic units on a row to particular locations is to place the unused basic units where they will provide the greatest relief from wiring congestion during the routing process. For this reason, the unused basic units should be located within the portion of the row region where wiring congestion reduction is most needed. The portion of the row region where congestion reduction is most needed depends on the particular placement and routing process employed and the physical configuration of the universal array being customized. Thus, if there is a large number of rows which tend to have similar wiring congestion, the ideal distribution for assigning unused basic units among the rows may be more of a plateau than a pyramid. Similarly, it may be advantageous to concentrate most or all of the unused basic units on a given row in the inner part of the row, rather than distributing them equally across the row as the process 400 does. Such a inner concentrated distribution is illustrated in row 95 in FIG. 11. Row 95 has a division line 96 and has one unused basic unit 97 tied to it and has the rest of the unused basic units 98 tied to tie-down points 99 which are concentrated in the inner part of the row.

The most advantageous distribution of the unused basic units on a row may be different in the central rows of the row region than it is nearer to the top or bottom of the row region. Thus, other distribution schemes than the ones illustrated may be used without departing from the scope of the invention which encompasses distributing the unused basic units in a manner which facilitates completion of all the routes even in complex logic circuits which have high gate untilization.

After completion of the basic unit tie-down process, the phase two placement process proceeds to arranging the logic cells on each row in a manner which its quality criteria indicate is optimum. This portion of the placement process is in accordance with the prior art as far as its manipulation techniques and quality criteria are concerned. That completes the cell placement process. The overall computer aided design process for producing the customizing mask proceeds to the routing portion of the automatic placement and routing process. An improved routing process for use in the computer aided design system 20 is the subject of the related application cited above. Once that routing process is completed, the specification of the customizing mask is transmitted through the artwork conversion system 38 and the graphics editor 44 to the artwork mask generating system 46 which produces the mask pattern. Thereafter, that mask pattern can be used to customize a stock universal array wafer to provide the desired IC.

What is claimed is:

1. In a computer-programmed method of placing logic cells during the conversion of a universal array having a row region including rows of basic circuit units into a custom IC in which said array has more of said basic units in its row region than said IC requires for it's implementation whereby the final IC includes some unused basic units, the improvement comprising the step of:
   allocating at least some of said unused basic units to specific rows of said row region with the center row when there are an odd number of rows and one of the center two rows when there are an even number of rows being allocated the most unused basic units and with the number of unsed basic units allocated to said rows decreasing monotonically with the distance from said center row(s); and
   preventing said allocated unused basic units from being moved from the respective rows to which they are allocated.

2. The method recited in claim 1 wherein said allocating step allocates fewer unused basic units to each successive row as the row distance from said center row(s) increases.

3. The method recited in claim 1 further comprising:
   exchanging selected pairs of logic cells, while restricting the exchange process to retaining said unused basic units in the rows to which they are allocated.

4. The method recited in claim 1 in which for at least some rows which contain more that one of said unused basic units, the method further comprises the step of:
   spacing said unused basic units at intervals along said row.

5. The method recited in claim 4 wherein said spacing step comprises:
   restricting each of said spaced apart unused basic units to being within a predetermined number of basic units of an associated fixed point along said row.

6. The method recited in claim 4 wherein said spacing step includes:
   dividing a row into at least two sections and distributing said unused basic units among said sections in accordance with an assigned priority; and
   distributing along each of said sections those unused basic units assigned to that section.

7. In a computer programmed method for placing logic cells in a universal array having a row region including parallel rows of basic circuit units, the improvement comprising the step of:
   establishing for each row, a maximum number of said basic units which are allows to be connected into the IC, said maximum number being equal to the number of said basic units actually present in that row minus a variable number which depends on (1) the location of the row within the row region and (2) the number of said basic units present in the universal array which are unused in the custom circuit being designed, said variable number having its largest value for the center row when the there are an odd number of rows and one of the center two rows when there are an even number of rows in said row region and having a value for other rows which decreaess monotonically with increasing distance of said other rows from said center row(s), the sum of said variable number over all rows being less than or equal to a predetermined portion of said unused basic units.

8. In a method of placing logic cells in a universal array having a row region including parallel rows of basic circuit units in which logic cells are initially assigned to rows and then moved from row to row or pair exchanged in accordance with evaluation criteria which include the number of skipped rows for a node and the number of rows spanned by the node, the improvement comprising:
   including in said evaluation criteria the minimization of the number of cells in a node in excess of two on a row.

9. The method recited in claim 8 wherein the minimization of the number of cells in a node in excess of two on a row has a lower priority than either the number of skipped rows or the number of rows spanned by the node.

10. The method recited in claim 9 wherein said method of placing is iterative and allows the rows to have fictitious lengths during part of the iterative process of establishing a preferred final logic cell placement which fits in the actual rows and when none of the three stated criteria provide a basis for choosing between two placements, a preference is given to a placement which shortens a longest row or lengthens a row which is shortest or within a tolerance of being shortest.

11. In a computer programmed method of converting a logic specification for an IC into the mask necessary to convert a universal array into said IC wherein the universal array of of the type which includes pre-placed basic circuit units arranged in parallel rows in a row region and includes more of said basic units than said IC requires for its implementation such that the final IC includes unused basic units, the method being one which (1) automatically determines the placement of logic cells on the rows of the universal array, (2) automatically determines routes for conductors to properly interconnect the universal aray basic units to produce said IC and (3) automatically generates the masks necessary to convert the universal array to said IC, the improvement comprising the step of:
   allocating at least some of said unused basic units to specific rows of said row region with the center row when there are an odd number of rows and one of the center two rows when there are an even number of rows being allocated the most unused basic units and with the number of unused basic units allocated to said row decreasing monotonically with the distance from said center row(s); and
   preventing said allocated unused basic units from being moved from the respective rows to which they are allocated.

12. A computer programmed method of converting a logic specification for an IC into the mask nessary to convert a universal array into said IC in which said array has a row region including parallel rows of basic circuit units and has more basic units in its row region than said IC requires for it's implementation whereby the final IC includes some unused basic units, and wherein said universal array is of the type in which said basic units are pre-placed in parallel rows in said row region, the method comprising the steps of:

(1) assigning specific logic cells to specific rows of said universal array, said assigning step including allocating at least some of said unused basic units to specific rows of said row region with the center row when there are an odd number of rows and one of the center two rows when there are an even number of rows being allocated the most unused basic units and with the number of unused basic units allocated to said rows decreasing monotonically with the distance from said center row(s);

(2) placing said logic cells assigned to each row at specific locations along that row;

(3) routing customizing conductors to properly interconnect said basic units of said universal array to product said IC;

(4) providing an output specifying the configuration of a mask for customizing said universal array to form said IC; and (5) generating said mask.

13. In a customized universal array IC of the type including a row region in which basic units are arranged in a plurality of parallel rows and in which some of said basic units are active and some are unused, the improvement comprising:

said unused basic units being distrubuted among said rows with the largest number of said unused basic units disposed in the center row when there are an odd number of rows and one of the center two rows when there are an even number of rows and with the number of unused basic units in each row decreasing monotonically with the distance of that row from said center row(s).

14. The IC recited in claim 13 wherein said distribution among said rows is pyramidal with the center row(s) containing the most unused basic units and the outermost rows containing the fewest unused basic units.

15. The IC recited in claim 14 wherein within rows which contain said unused basic units, said unused basic units are interspersed with said active basic units.

16. The IC recited in claim 15 wherein said unused basic units in at least some rows are spaced along at least a portion of said row at substantially constant intervals.

* * * * *

UNITED STATES PATENT AND TRADEMARK OFFICE
CERTIFICATE OF CORRECTION

PATENT NO. : 4,686,629

DATED : August 11, 1987

INVENTOR(S): Richard Noto et al.

It is certified that error appears in the above-identified patent and that said Letters Patent is hereby corrected as shown below:

Column 3, line 6, "utiltized" should be --utilized--.

Column 3, line 61, "citerion" should be --criterion--.

Column 5, line 37, "technoloy" should be --technology--.

Column 6, line 17, "Ser. No. 475,511" should be --Ser. No. 474,511--.

Column 6, line 40, "dependant" should be --dependent--.

Column 9, line 51, "the the" should be --the--.

Column 10, line 17, after "complete" insert a period (.).

Column 10, line 33, after "rejects" insert a period (.).

Column 11, line 61, delete "L".

Column 12, line 12, "ror" should be --for--.

Column 12, line 47, "paramter" should be --parameter--.

Column 16, line 62, "untilization" should be --utilization--.

Column 17, line 27, "unsed" should be --unused--.

Column 17, line 35, "unsused" should be --unused--.

Column 17, line 44, "that" should be --than--.

Column 17, line 61, "computer programmed" should be --computer-programmed--.

UNITED STATES PATENT AND TRADEMARK OFFICE
CERTIFICATE OF CORRECTION

PATENT NO. : 4,686,629

DATED : August 11, 1987

INVENTOR(S): Richard Noto et al.

It is certified that error appears in the above-identified patent and that said Letters Patent is hereby corrected as shown below:

Column 17, line 66, "allows" should be --allowed--.

Column 18, line 6, "the there" should be --there--.

Column 18, line 43, "of of" should be --is of--.

Column 18, line 51, "aray" should be --array--.

Column 18, line 61, "row" should be --rows--.

Column 18, line 67, "nessary" should be --necessary--.

Column 19, line 23, "product" should be --produce--.

Signed and Sealed this

Tenth Day of May, 1988

Attest:

DONALD J. QUIGG

Attesting Officer

Commissioner of Patents and Trademarks